United States Patent
Redman-White

(10) Patent No.: US 7,508,273 B2
(45) Date of Patent: Mar. 24, 2009

(54) QUADRATURE CLOCK DIVIDER

(75) Inventor: William Redman-White, Medstead (GB)

(73) Assignee: NXP B.V., Eindhoven (NL)

( * ) Notice: Subject to any disclaimer, the term of this patent is extended or adjusted under 35 U.S.C. 154(b) by 138 days.

(21) Appl. No.: 10/545,865

(22) PCT Filed: Mar. 19, 2004

(86) PCT No.: PCT/IB2004/000808
§ 371 (c)(1),
(2), (4) Date: Dec. 7, 2006

(87) PCT Pub. No.: WO2004/084412
PCT Pub. Date: Sep. 30, 2004

(65) Prior Publication Data
US 2007/0139127 A1  Jun. 21, 2007

Related U.S. Application Data

(60) Provisional application No. 60/455,937, filed on Mar. 19, 2003.

(51) Int. Cl.
*H03L 7/00* (2006.01)
(52) U.S. Cl. .............................. 331/16; 331/51; 331/74; 377/47; 377/48; 327/115; 327/117

(58) Field of Classification Search ................... 331/16, 331/51, 74; 377/47, 48; 327/115, 117
See application file for complete search history.

(56) References Cited

U.S. PATENT DOCUMENTS

| 6,570,946 B1 * | 5/2003 | Homol et al. ................ 375/371 |
| 6,888,913 B2 * | 5/2005 | Walker ......................... 377/47 |
| 2003/0020523 A1 | 1/2003 | Dalt | |

FOREIGN PATENT DOCUMENTS

| EP | 0 661 810 | 7/1995 |
| EP | 1 133 058 | 9/2001 |

OTHER PUBLICATIONS

Hillock T H: "Digital Non-Integer Frequency Divider" IBM Technical Disclosure Bulletin, IBM Corp. New York, US, vol. 20, No. 12, May 1978, p. 5214.

* cited by examiner

*Primary Examiner*—Arnold Kinkead

(57) ABSTRACT

A divide-by-n process is effected via a scale-by-four/n process followed by a divide-by-four process. A quadrature input clock facilitates a scale-by-four/n process, via a clock-phase selection process. By incorporating a terminal divide-by-four process, quadrature output signals are easily provided. A divide-by-three quadrature divider effects the scale-by-4/n process via a selection of every third quadrature clock phase, and the quadrature output of the divide-by-four process provides the control signals to effect this every-third clock phase selection.

16 Claims, 1 Drawing Sheet

QUADRATURE CLOCK DIVIDER

CROSS REFERENCE TO RELATED APPLICATION

This application claims the benefit of U.S. provisional application Ser. No. 60/455,937 filed 19 Mar. 2003, which is incorporated herein by reference.

This invention relates to the field of electronics and communications, and in particular to a system and method for generating a quadrature clock signal.

Quadrature signaling is commonly used in communication systems, wherein two signals are used to encode an information signal, each of the two signals being separated in phase by a quarter-cycle. To encode, decode, or otherwise process these quadrature-phase signals, a quadrature clock is used, wherein each of two clock signals are separated in phase by a quarter-cycle. A divide-by-four counter is commonly used to generate the quadrature clock signals.

Communication systems are commonly structured to down-convert a high-frequency input signal for subsequent processing at a lower intermediate frequency. Typically, the intermediate frequency is an integer-division of the high frequency of the input signal.

U.S. Pat. No. 6,389,095, issued 14 May 2002 to Bo Sun, discloses a divide-by-three counter. This counter includes a pair of flip-flops that are configured to generate an "in-phase" output clock (Iout) at one-third the frequency of an input in-phase clock (Iin), and another pair of flip-flops that generate a "quadrature-phase" output clock (Qout) at one-third the frequency of an input quadrature-phase clock (Qin). The pairs of flip-flops are appropriately coupled to minimize redundancy.

It is an object of this invention to provide a system and method for efficiently generating a divide-by-n clock signal from a quadrature input clock. It is a further object of this invention to provide a system and method for efficiently generating a divide-by-n quadrature output clock signal from an input clock. It is a further object of this invention to provide a system and method for efficiently generating a divide-by-n quadrature output clock signal from a quadrature input clock. It is a further object of this invention to provide a system and method for efficiently generating a divide-by-three quadrature output clock from a quadrature input clock.

These objects, and others, are achieved by a system and method that effects a divide-by-n process via a scale-by-4/n process followed by a divide-by-four process. A quadrature input clock facilitates a scale-by-4/n process, via a clock-phase selection process. By incorporating a terminal divide-by-four process, quadrature output signals are easily provided. A divide-by-three quadrature divider effects the scale-by-4/n process via a selection of every third quadrature clock phase, and the quadrature output of the divide-by-four process provides the control signals to effect this every-third clock phase selection.

Throughout the drawings, the same reference numeral refers to the same element, or an element that performs substantially the same function.

Figure 1:
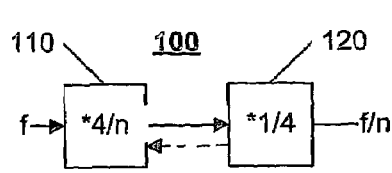
FIG. 1 illustrates an example block diagram of a divide-by-n clock generator in accordance with this invention.
Figure 2:
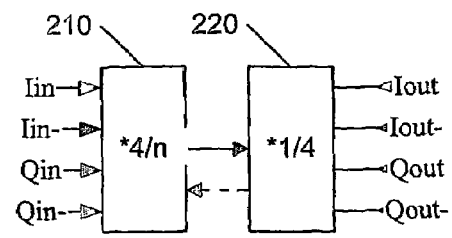
FIG. 2 illustrates an example block diagram of a quadrature divide-by-n clock generator in accordance with this invention.

FIG. 1 illustrates an example block diagram of a divide-by-n clock generator 100 in accordance with this invention. The divide-by-n clock generator 100 includes a 4/n scaler 110 followed by a divide-by-four counter 120; optionally, feedback may be provided from the counter 120 to the scaler 110 to facilitate control or to reduce complexity, as detailed below. The illustrated structure is provided to facilitate use in quadrature clock systems, wherein a quadrature clock is available as an input clock, or a quadrature clock is desired as an output clock, or both, as illustrated in FIG. 2. A quadrature input clock facilitates the implementation of a 4/n scaler, as detailed below, and a divide-by-four counter 120 facilitates the generation of a quadrature output clock, as also detailed below. Note that although this invention is particularly well suited for a quadrature-input to quadrature-output divide-by-n process, the advantages provided by either the input scaler 110 or the output counter 120 can be realized for providing an efficient quadrature-input-single-output divider, or a single-input-quadrature-output divider. Hereinafter, the invention is presented as a quadrature-input quadrature-output divider.

FIG. 2 illustrates an example block diagram of a quadrature divide-by-n clock generator in accordance with this invention. A quadrature 4/n scaler 210 provides an intermediate clock signal at 4/n times the frequency of the quadrature input clock. The quadrature input clock includes four input signals, Iin, Qin, Iin−, and Qin−, at relative phases of 0, 90°, 180°, and 270°, respectively. That is, each of the available input clock signals are a quarter-cycle apart.

Typically, a fractional scaling, such as a general m/n scaling, is a complex process, and often produces a significant amount of phase-jitter. However, in this application, with a quadrature input clock, a 4/n scaling can be effected via a clock-selection scheme. That is, for example, a 4/3 scaling can be effected by selecting every third quarter-phase clock signal; a 4/5 scaling can be effected by selecting every fifth quarter-phase clock signal, and so on. That is, a 4/3 scaling is effected by selecting, from among the available input clocks Iin, Qin, Iin−, and Qin−, the input clock signal that occurs at 0°, 270°, 540°, 810°, 1080°, and so on; a 4/5 scaling selects the input clock signal that occurs at 0°, 450°, 900°, and so on. Because these input clock signals are assumed to be accurate in phase-relationship to each other, the output clock signal will exhibit minimal phase-jitter. As is known in the art, a selection from among multiple available input signals is generally effected via a multiplexer, and thus the quadrature-input 4/n scaler 210 is merely a 4:1 multiplexer, with appropriate selection control signals.

Figure 3:
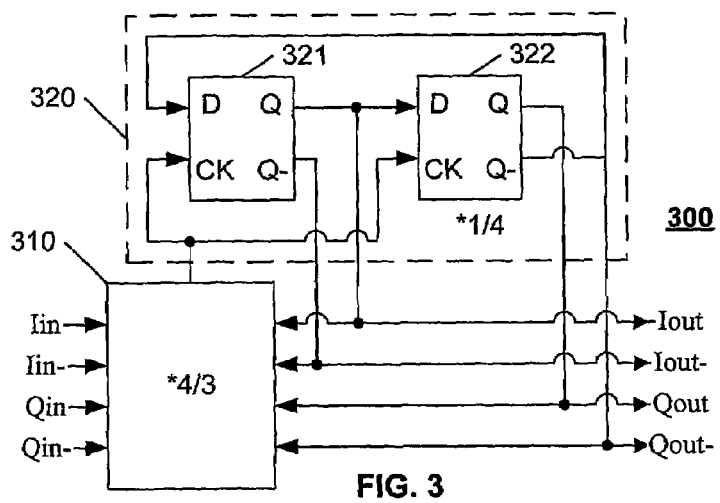
FIG. 3 illustrates an example block diagram of a divide-by-three clock generator in accordance with this invention.

The divide-by-four counter 220 is a conventional divide-by-four counter, an example of which is detailed in FIG. 3. The counter 220 receives a single clock input and generates four output signals Iout, Qout, Iout−, Qout−, at relative phases of 0, 90°, 180°, and 270°, respectively, at one-fourth the frequency of the intermediate clock input. Because the intermediate clock input is at 4/n of the frequency of the quadrature clock input to the scaler 210, these quadrature output signals are at a frequency of 1/n of the quadrature clock input.

FIG. 3 illustrates an example block diagram of a divide-by-three clock generator in accordance with this invention. In a preferred embodiment of this invention, the quadrature clock output signals Iout, Qout, Iout−, and Qout− are used to effect the selection from among the quadrature clock input signals to effect a 4/3 scaling, as detailed in FIG. 4. As noted above, to achieve a 4/3 scaling, the clock signals that occur at 0°, 270°, 540°, 810°, 1080°, and so on are sequentially selected. Equivalently stated, the single intermediate output clock of the 4/3 scaler 310 corresponds to the sequential selection of clock input signals Iin, Qin−, Iin−, Qin, Iin, Qin−, and so on.

Figure 4:
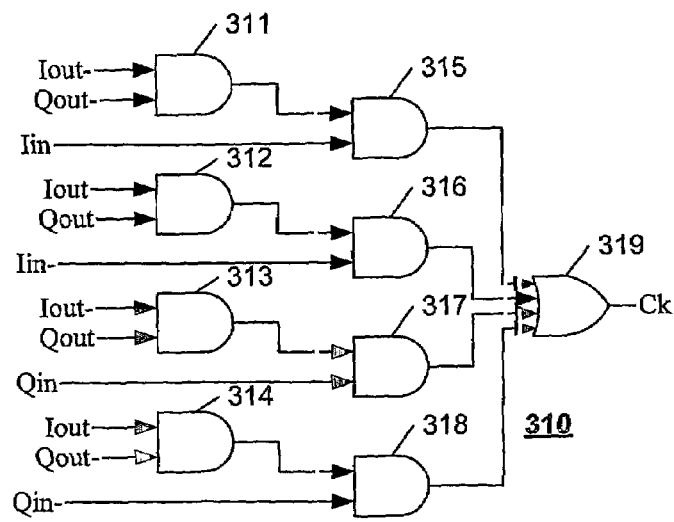
FIG. 4 illustrates an example block diagram of a 4/3 scaler for use in a divide-by-three clock generator in accordance with this invention.

FIG. 4 illustrates an example block diagram of a 4/3 scaler for use in a divide-by-three clock generator in accordance with this invention. One of ordinary skill in the art will recognize FIG. 4 as a block diagram of a 4:1 multiplexer. In Boolean terms, the intermediate clock signal Ck is given as:

$$Ck=(Iout-*Qout-)*Iin+(Iout*Qout-)*Qin-+\\(Iout*Qout)*Iin-+(Iout-*Qout)*Qin.$$

The principle of operation of this circuit is as follows. Assume an initial state of Iout and Qout being reset to zero. In this state, the AND gate 311 enables gate 315 to propagate the Iin clock signal to the gate 319, while each of the other gates 312-314 disable their corresponding gatesw 316-318. When the active edge of Iin occurs and is propagated to the clock output Ck, this clock triggers the divide-by-four counter 220 in FIG. 3 to toggle the Iout signal. With the Iout signal asserted, gate 311 disables the gate 315, preventing a further propagation of the Iin signal to the output clock Ck. The assertion of Iout causes gate 314 to enable gate 318, thereby propagating the Qin−signal to the output clock Ck, as desired. When the Qin−signal is propagated to the divide-by-four counter 220, the Qout signal is toggled, which subsequently disables gate 318 and enables gate 316, propagating the Iin−signal to the clock output Ck. When the Iin−signal triggers the counter 220, the Iout signal is again toggled, which disables gate 316, and enables gate 313, thereby propagating the Qin signal to the clock output Ck. When the Qin signal toggles the divide-by-four counter 220, the Qout signal is again toggled, returning the counter 220 to the initial reset state, and the above describe sequence is repeated.

As will be evident to one of ordinary skill in the art, the logic function illustrated in FIG. 4 need not be implemented as logic gates, per se. In a preferred embodiment, for example, current steering logic is used to achieve high-speed performance.

One of ordinary skill in the art will also recognize that other combinations of input control signals to a conventional 4:1 multiplexer can be devised to select every-$n^{th}$ quarter-cycle input clock signal, although additional sequential circuitry will be required to distinguish among full cycles. For example, the selection of every $7^{th}$ quarter-cycle input to effect a 4/7 scaling uses the same sequential selection of Iin, Qin−, Iin−, Qin, Iin, etc. as the above-described selection of every $3^{rd}$ quarter-cycle input, and an additional control signal is required to disable all of the selectors 315-318 for a full clock cycle of the input signals. In like manner, the selection of every $5^{th}$ quarter-cycle input requires a full clock cycle disablement to distinguish selection of every $1^{st}$ quarter-cycle; the selection of every $11^{th}$ quarter-cycle input to effect a 4/11 scaling requires a two-cycle disablement; and so on.

As illustrated, this invention is particularly well suited to effect a divide-by-three quadrature-input quadrature-output clock generator. The divide-by-3 clock generator 300 of FIG. 3 generates a quadrature clock output signal from a quadrature clock input signal with one pair of flip-flops and one 4:1 multiplexer, as compared to the aforementioned requirement of two pairs of flip-flops and some combinational logic in the referenced '095 patent. Similar efficiencies will be exhibited in other divide-by-n embodiments.

The foregoing merely illustrates the principles of the invention. It will thus be appreciated that those skilled in the art will be able to devise various arrangements which, although not explicitly described or shown herein, embody the principles of the invention and are thus within its spirit and scope. For example, other frequency output signals can be obtained from the illustrated divide-by-n counter of this invention. For example, a frequency of 4/n can be obtained directly at the output of the 4/n scaler 210. Similarly, a frequency of 2/n can be obtained by forming the exclusive-OR of the quadrature outputs, Iout and Qout, of the divide-by-n counter. These and other system configuration and optimization features will be evident to one of ordinary skill in the art in view of this disclosure, and are included within the scope of the following claims.

What is claimed is:

1. A divide-by-n system comprising:
    a scaler that is configured to effect a scaling of an input frequency of an input clock to produce an intermediate clock at an intermediate frequency of 4/n times the input frequency, and
    a counter that is configured to effect a division of the intermediate frequency to produce an output clock at an output frequency that is ¼ times the intermediate frequency;
    wherein the output clock includes a set of four output quadrature clock signals (Iout, Iout−, Qout, Qout−).

2. The system of claim 1, wherein the scaler includes a 4:1 multiplexer.

3. The system of claim 2, wherein the input clock includes a set of input quadrature clock signals (Iin, Iin−, Qin, Qin−).

4. The system of claim 1, wherein the input clock includes a set of input quadrature clock signals (Iin, Iin−, Qin, Qin−).

5. The system of claim 1, wherein the set of output quadrature clock signals (Iout, Iout−, Qout, Qout−) are operatively coupled to the scaler to facilitate the scaling of the input clock.

6. The system of claim 1, wherein the input clock comprises a set of quadrature input clock signals Iin, Iin−, Qin, and Qin−; and the scaler provides the intermediate clock Ck as: Ck=(Iout−*Qout−)*Iin+(Iout*Qout−)*Qin−+(Iout*Qout)*Iin−+(Iout−*Qout)*Qin, thereby effecting a divide-by-three process.

7. The system of claim 1, further including another output clock that is generated via an exclusive-OR of two of the output quadrature clock signals (Iout, Qout).

8. The system of claim 1, wherein the intermediate clock is provided as another output clock of the system.

9. A method of dividing an input frequency of an input clock to produce an output clock at an output frequency that is equal to the input frequency divided by a factor of n, comprising:
    scaling the input clock to produce an intermediate signal at 4/n times the input frequency, and
    dividing the intermediate signal by a factor of 4 to produce the output clock at the output frequency;
    wherein the output clock includes a set of four output quadrature clock signals (Iout, Iout−, Qout, Qout−).

10. The method of claim 9, wherein the input clock includes a set of quadrature input clock signals (Iin, Iin−, Qin, Qin−).

11. The method of claim 10, wherein scaling the input clock is effected by a selection from among the set of quadrature input clock signals (Iin, Iin−, Qin, Qin−).

12. The method of claim 9, wherein the input clock comprises a set of quadrature input clock signals Iin, Iin−, Qin, and Qin−; and scaling (210) the input clock to produce the intermediate signal Ck is effected as: Ck=(Iout−*Qout−)*Iin+(Iout*Qout−)*Qin−+(Iout*Qout)*Iin−+(Iout−* Qout)*Qin, thereby effecting a divide-by-three process.

13. The method of claim 9, further including generating another output clock via an exclusive-OR of two of the quadrature output clock signals (Iout, Qout).

14. The method of claim 9, wherein the intermediate signal is provided as another output clock.

15. A divide-by-n system comprising:
- a scaler that is configured to effect a scaling of an input frequency of an input clock to produce an intermediate clock at an intermediate frequency of 4/n times the input frequency, and
- a counter that is configured to effect a division of the intermediate frequency to produce an output clock at an output frequency that is ¼ times the intermediate frequency;

wherein the intermediate clock is provided as another output clock of the system.

16. A method of dividing an input frequency of an input clock to produce an output clock at an output frequency that is equal to the input frequency divided by a factor of n, comprising:
- scaling the input clock to produce an intermediate signal at 4/n times the input frequency, and
- dividing the intermediate signal by a factor of 4 to produce the output clock at the output frequency;

wherein the intermediate signal is provided as another output clock.

* * * * *